(12) United States Patent
Patel et al.

(10) Patent No.: US 11,095,075 B2
(45) Date of Patent: Aug. 17, 2021

(54) ELECTRICAL DEVICE WITH A PLUG CONNECTOR HAVING A FLEXIBLE SECTION

(71) Applicant: TE CONNECTIVITY CORPORATION, Berwyn, PA (US)

(72) Inventors: Sandeep Patel, Middletown, PA (US); Dustin Grant Rowe, Harrisburg, PA (US); Bruce Allen Champion, Camp Hill, PA (US); Alex Michael Sharf, Harrisburg, PA (US)

(73) Assignee: TE CONNECTIVITY SERVICES GmbH, Schaffhausen (CH)

( * ) Notice: Subject to any disclaimer, the term of this patent is extended or adjusted under 35 U.S.C. 154(b) by 0 days.

(21) Appl. No.: 16/250,442

(22) Filed: Jan. 17, 2019

(65) Prior Publication Data
US 2020/0235525 A1    Jul. 23, 2020

(51) Int. Cl.
*H01R 13/6471*      (2011.01)
*H01R 12/62*        (2011.01)
(Continued)

(52) U.S. Cl.
CPC ......... *H01R 13/6471* (2013.01); *H01R 12/62* (2013.01); *H01R 12/727* (2013.01); *H01R 13/6587* (2013.01); *H05K 3/361* (2013.01); *H01R 4/023* (2013.01); *H01R 12/57* (2013.01); *H01R 12/592* (2013.01); *H01R 12/594* (2013.01); *H01R 12/61* (2013.01); *H01R 12/714* (2013.01); *H01R 12/721* (2013.01); *H01R 12/77* (2013.01); *H01R 12/79* (2013.01); *H01R 13/02* (2013.01); *H01R 13/502* (2013.01);
(Continued)

(58) Field of Classification Search
CPC ...... H01R 12/79; H01R 12/592; H01R 12/57; H01R 12/62; H01R 12/721; H01R 12/594; H01R 4/023; H01R 12/61; H01R 12/714; H01R 12/77; H01R 13/6471; H01R 12/727; H01R 13/6587; H01R 2107/00; H01R 13/02; H01R 13/665; H01R 13/502; H05K 3/361; H05K 2201/10189; H05K 1/189; H05K 1/028; H05K 2201/058; H05K 1/147

See application file for complete search history.

(56) References Cited

U.S. PATENT DOCUMENTS 5,710,393 A    1/1998  Smith et al.
6,055,722 A    5/2000  Tighe et al.
(Continued)

*Primary Examiner* — Abdullah A Riyami
*Assistant Examiner* — Justin M Kratt

(57) ABSTRACT

An electrical device including a plug connector. The plug connector includes a first flexible substrate having a plurality of signal contacts, the first flexible substrate extending from a terminating end to a mating end and configured to be flexible between the terminating end and mating end. A second flexible substrate extends in parallel spaced relation to the first flexible substrate to form a cavity between the first flexible substrate and second flexible substrate. The second flexible substrate having a plurality of signal contacts. The second flexible substrate extends from a terminating end to a mating end and configured to be flexible between the terminating end and mating end. The plug connector includes a rigid section disposed in the cavity at the mating end, the first flexible substrate moves in relation to the rigid section.

17 Claims, 3 Drawing Sheets

(51) Int. Cl.
  *H01R 12/72*   (2011.01)
  *H01R 13/6587*  (2011.01)
  *H05K 3/36*    (2006.01)
  *H01R 107/00*   (2006.01)
  *H01R 12/79*    (2011.01)
  *H05K 1/02*     (2006.01)
  *H01R 13/502*   (2006.01)
  *H01R 12/77*    (2011.01)
  *H01R 13/02*    (2006.01)
  *H01R 12/59*    (2011.01)
  *H05K 1/14*     (2006.01)
  *H01R 12/61*    (2011.01)
  *H01R 12/57*    (2011.01)
  *H01R 4/02*     (2006.01)
  *H01R 13/66*    (2006.01)
  *H01R 12/71*    (2011.01)
  *H05K 1/18*     (2006.01)

(52) U.S. Cl.
  CPC ........ *H01R 13/665* (2013.01); *H01R 2107/00* (2013.01); *H05K 1/028* (2013.01); *H05K 1/147* (2013.01); *H05K 1/189* (2013.01); *H05K 2201/058* (2013.01)

(56) References Cited

U.S. PATENT DOCUMENTS

| | | | |
|---|---|---|---|
| 8,292,655 B1 | 10/2012 | Ling et al. | |
| 8,753,144 B2 * | 6/2014 | Nakamura | H01R 9/032 |
| | | | 439/493 |
| 2014/0206230 A1 * | 7/2014 | Rost | H01R 12/53 |
| | | | 439/607.01 |
| 2017/0194721 A1 * | 7/2017 | Fan | H01R 12/52 |

* cited by examiner

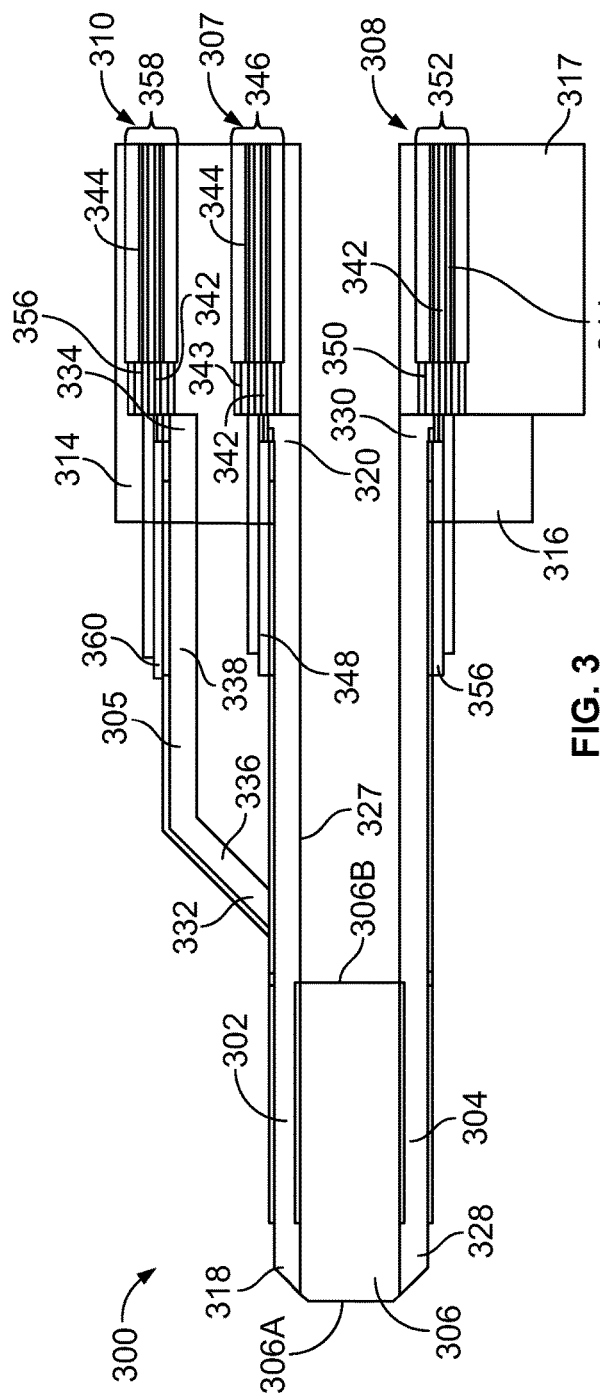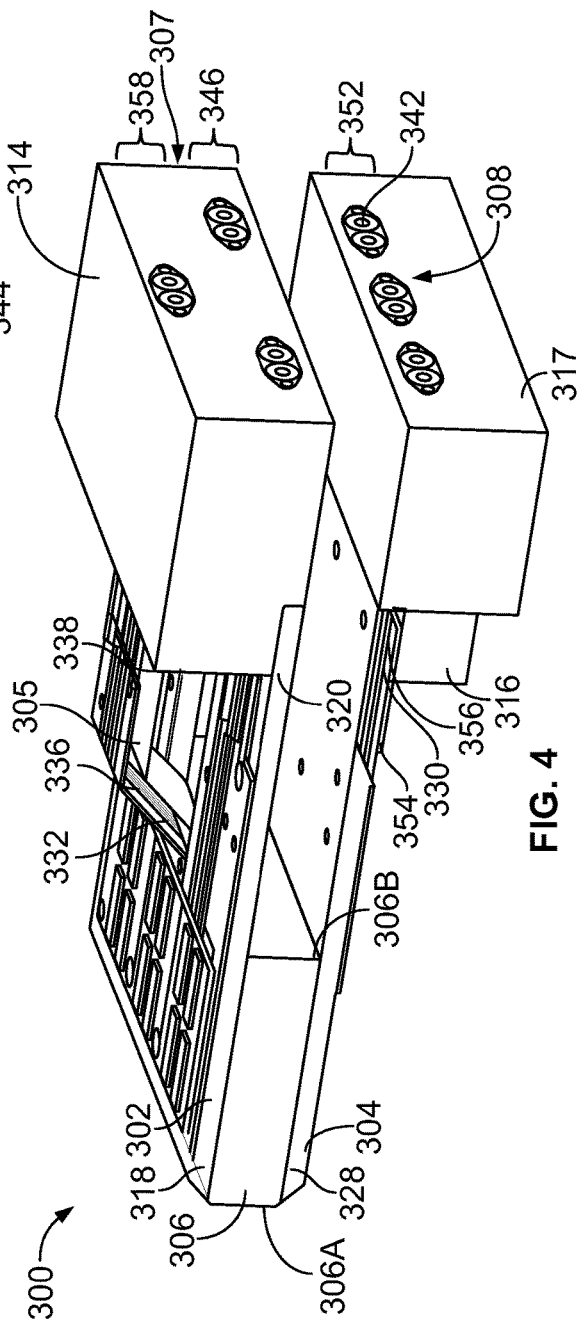
FIG. 3
FIG. 4

ELECTRICAL DEVICE WITH A PLUG CONNECTOR HAVING A FLEXIBLE SECTION

BACKGROUND OF THE INVENTION

The subject matter herein relates generally to electrical connectors that have signal and ground contacts.

Communication systems exist today that utilize electrical connectors to transmit data. For example, network systems, servers, data centers, and the like may use numerous electrical connectors to interconnect the various devices of the communication system. Many electrical connectors, such as direct attach cables (DACs) include signal conductors and ground conductors in which the signal conductors convey data signals and the ground conductors reduce crosstalk and/or electromagnetic interference (EMI) between the signal conductors. In differential signaling applications, the signal conductors are arranged in signal pairs for carrying the data signals. Each signal pair may be separated from an adjacent signal pair by one or more ground conductors.

There has been a general demand to decrease crosstalk and/or electromagnetic interference (EMI) without sacrificing spatial demands of an electrical connector. However, small gages of cables are unable to fit on a printed circuit board while improving such crosstalk improvement in a cable termination. This leads to increase in trace loss in order to stagger pairs of cables.

Accordingly, there is a need for electrical connectors that reduce the electrical noise to improve crosstalk while maintaining spatial characteristics.

BRIEF DESCRIPTION OF THE INVENTION

In an embodiment, a plug connector is provided that includes at least one flexible substrate having a plurality of signal contacts. The flexible substrate extends from a terminating end to a mating end and is configured to be flexible between the terminating end and mating end. The mating end being rigid and configured to be plugged into a mating electrical connector.

In another embodiment, an electrical device is provided that includes a plug connector having a first flexible substrate with a plurality of signal contacts. The first flexible substrate extends from a terminating end to a mating end and configured to be flexible between the terminating end and mating end. A second flexible substrate extends in parallel spaced relation to the first flexible substrate to form a cavity between the first flexible substrate and second flexible substrate and having a plurality of signal contacts. The second flexible substrate extends from a terminating end to a mating end and is configured to be flexible between the terminating end and mating end. The plug connector includes a rigid section disposed in the cavity at the mating ends, and the first flexible substrate moves in relation to the rigid section.

In another embodiment, an electrical device is provided. The electrical device includes a first flexible substrate having a plurality of signal contacts, the first flexible substrate extending from a terminating end to a mating end. The electrical device also includes a first set of communication cables, each set of communication cables including a plurality of signal conductors. Each of the plurality of signal conductors is terminated to a corresponding signal contact of the first flexible substrate. A second flexible substrate is coupled to the first flexible substrate having a plurality of signal contacts, the second flexible substrate extending from a terminating end to a mating end. The electrical device also includes a second set of communication cables, each set of communication cables including a plurality of signal conductors. Each of the plurality of signal conductors is terminated to a corresponding signal contact of the second flexible substrate. Additionally, the first set of communication cables is offset from the second set of communication cables.

BRIEF DESCRIPTION OF THE DRAWINGS

FIG. 3 is a side plan view of an electrical device in accordance with an exemplary embodiment.

FIG. 4 is a perspective view of an electrical device in accordance with an exemplary embodiment.

DETAILED DESCRIPTION OF THE INVENTION

Embodiments set forth herein may include various electrical connectors that are configured for communicating data signals. The electrical connectors may mate with a corresponding mating connector to communicatively interconnect different components of a communication system. In the illustrated embodiment, the electrical connector is a plug connector, which may be terminated to and electrically coupled to another electrical component, such as a circuit board, a wire harness or another electrical component. The plug connector may be a pluggable input/output (I/O) connector, which may be mated with a corresponding receptacle connector during a mating operation. It should be understood, however, that the inventive subject matter set forth herein may be applicable in other types of electrical connectors.

In various embodiments, electrical connectors provide flexible circuit boards that in each embodiment are stacked on one another to form the electrical connector. Each embodiment includes a rigid section and a flexible section, and while in at least one embodiment the rigid section includes a rigid printed circuit board (PCB), in at least one embodiment the rigid section includes only flexible substrates such as flexible PCBs, also referred to as flex PCBs. For the purposes of this disclosure flexible means configured to conform to a desired shape, including through bending about a radius. In one example, a flexible PCB is able to bend at least forty-five (45) degrees without breaking. For the purposes of this disclosure rigid means configured to remain the same shape and not bend about a radius. In one example, a rigid PCB is unable to bend at most fifteen (15) degrees without breaking. In one such embodiment four layers of flexible substrates are stacked on top of one another with the first and second flexible substrates extending past the end of the third and fourth flexible substrates to form a four flexible substrate rigid section and a two flexible substrate flexible section. By utilizing the flexible section in the embodiments, cables may be staggered or offset from one another to improve cross talk while the flexible section maintains desired spatial requirements, including by reducing height and forming a right-angle plug. Therefore, stresses on raw cables are reduced increasing system life in addition to increasing performance.

Figures 1, 2:
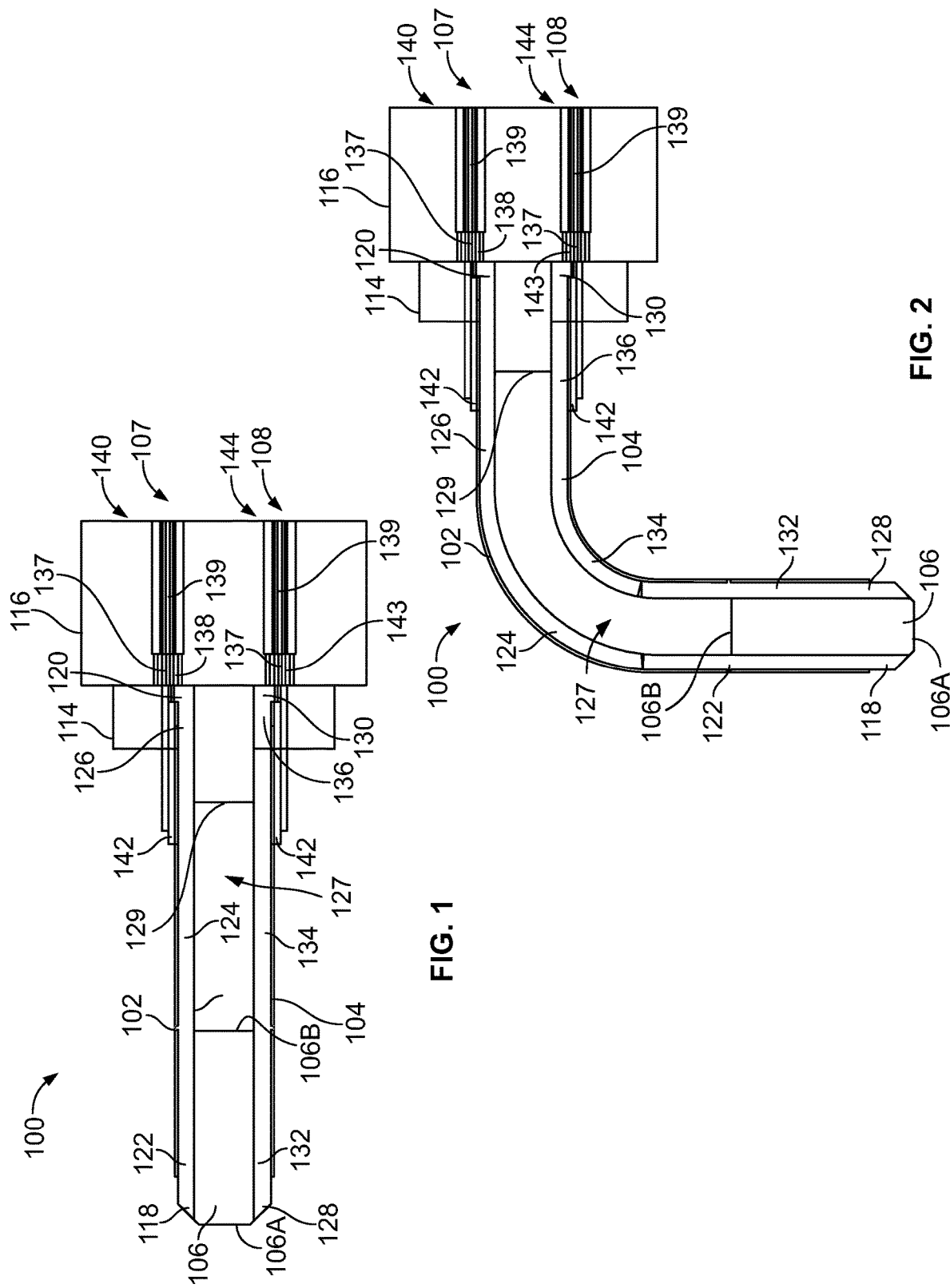
FIG. 1 is a side plan view of an electrical device in accordance with an exemplary embodiment.
FIG. 2 is a side plan view of an electrical device in accordance with an exemplary embodiment.

FIGS. 1 and 2 illustrate a side plan view of an exemplary electrical device 100 in a first position (FIG. 1) and second position (FIG. 2). In one exemplary embodiment the electrical device 100 is a direct attach connector. The electrical device 100 includes a first flexible substrate 102, a second flexible substrate 104, a rigid substrate 106 disposed between the first flexible substrate 102 and second flexible substrate 104, a first set of cables 107, a second set of cables 108, a first dielectric holder 114, and a second dielectric holder 116.

The first flexible substrate 102 extends from a first mating end 118 to a first terminating end 120. In one example embodiment the first flexible substrate 102 is a flexible printed circuit board (PCB). Between the first mating end 118 and first terminating end 120 the first flexible substrate 102 bends or is flexible between the first position (FIG. 1) to the second position (FIG. 2). In one example when the electrical device 100 is in the second position (FIG. 2) the electrical device 100 is a right-angle plug. Consequently, the first flexible substrate 102 includes a mating section 122 that includes the mating end 118, an arcuate section 124, and a terminating section 126 that includes the terminating end 120. While formed of flexible substrate material, in one embodiment both the mating section 122 and terminating section 126 remain generally straight while the arcuate section 124 is remains straight and in the first position (FIG. 1) and flexes or has an arcuate shape in the second position (FIG. 2).

The second flexible substrate 104 extends in parallel spaced relation to the first flexible substrate 102. Similar to the first flexible substrate 102, the second flexible substrate 104 extends from a second mating end 128 to a second terminating end 130. Between the second mating end 128 and second terminating end 130 the second flexible substrate 104 bends or flexes from the first position (FIG. 1) to the second position (FIG. 2). In one example when the electrical device 100 is in the second position (FIG. 2) the electrical device 100 is a right-angle plug. Consequently, the second flexible substrate 104 includes a mating section 132 that includes the mating end 128, an arcuate section 134, and a terminating section 136 that includes the terminating end 130. While formed of flexible substrate material, in one embodiment both the mating section 132 and terminating section 136 remain generally straight while the arcuate section 134 is remains straight in the first position (FIG. 1) and flexes or has an arcuate shape in the second position (FIG. 2).

The rigid substrate 106 is coupled to and extends between the first flexible substrate 102 and second flexible substrate 104 adjacent the first mating end 118 of the first flexible substrate 102 and the second mating end 128 of the second flexible substrate 104 to provide an electrical connection between the first and second flexible substrates 102 and 104. The rigid substrate 106 extends from a mating edge 106A to a terminating edge 106B. In this manner, the first flexible substrate 102, second flexible substrate 104, terminating edge 106B, and in this example embodiment an edge 129 of the rigid first dielectric holder 114 define an open cavity 127. Alternatively, (as illustrated in the example embodiment of FIGS. 3-4) the cavity in only defined by the terminating edge of the rigid substrate, and spaced flexible circuit boards. In this manner, the cavity 127 allows the first flexible substrate 102 and second flexible substrate 104 to bend as provided in FIG. 2. While in this example the rigid substrate 106 is disposed between and provides the connection between the first and second flexible substrates 102 and 104, in other examples (FIG. 5) layered flexible substrates form a rigid section of the electrical device 100 and a rigid substrate is not utilized. In each example embodiment, the mating end is thus rigid and configured to be plugged into a mating electrical connector (not shown). Additionally, in this example embodiment, the cavity is open, providing air therein; however, alternatively, a flexible substance such as foam could be disposed within, or fill the cavity, to provide insulation, enhance conductivity, improve durability, add robustness, and like.

The first set of cables 107 in one example comprises a plurality of signal conductors 137 disposed within a cable jacket 139, and a first ground signal conductor 138 that extends around and surrounds the signal conductors 137. Additionally, the plurality of signal conductors 137 are placed in side-by-side arrangement to form a first layer 140. The side-by-side plurality of dual signal conductors 137 within the first layer 140 are received by a plurality of corresponding signal contacts 142 such that each signal conductor 137 is received by a corresponding signal contact 142. In example embodiments the signal contacts 142 can be pads, plated via, and the like on the first flexible substrate 102. In one embodiment, each signal conductor 137 is a communication cable that relays a signal wherein EMI and interference along such cables results in cross talk.

The second set of cables 108 similarly in one example comprises a plurality of dual signal conductors 137 disposed within a cable jacket 139, and a second ground signal conductor 143 that extends around and surrounds the dual signal conductors 137. Additionally, the plurality of dual signal conductors 137 are placed in side-by-side arrangement to form a second layer 144. The side-by-side plurality of dual signal conductors 137 within the second layer 144 are received by a plurality of corresponding signal contacts 142 such that each signal conductor 137 is received by a corresponding signal contact 142. In example embodiments the signal contacts 142 can be pads, plated via, and the like on the second flexible substrate 104. In one embodiment, each signal conductor 137 is a communication cable that relays a signal wherein EMI and interference along such cables results in cross talk.

The first dielectric holder 114 secures the first and second sets of cables 107, 108 to the first and second flexible substrates 102, 104 respectfully. The first dielectric holder 114 may be an adhesive, hot melt, or the like. The second dielectric holder 116 meanwhile secures the plurality of side-by-side cable jackets 139 in the first layer 140 to one another, and the plurality of side-by-side cable jackets 139 in the second layer 144 to one another. The second dielectric holder 116 also secures the first and second sets of cables 107, 108 to the first terminating end 120 of the first flexible substrate 102 and the second terminating end 130 of the second flexible substrate 104. The second dielectric holder 116 may be an adhesive, hot melt, or the like. While described as a first dielectric holder 114 and second dielectric holder 116, in example embodiments the first dielectric holder 114 and second dielectric holder 116 are of one piece construction.

In all, the electrical device 100 presents a connector that is able to be flexible or bend between a terminating end and mating end to reduce height of the electrical device 100. Additionally, the flexibility of the electrical device 100 reduces stress on raw cables connected to the electrical device. While in this example embodiment first and second flexible substrates 102, 104 are utilized, alternatively, two flexible substrate surfaces may be utilized such that a single flexible substrate is provided. In one example two independently flexible substrates are joined or coupled. Alternatively, a single substrate is provided that has two mechanically independent sections that are coupled, or joined, at a common base. Thus, a single flexible substrate may be utilized.

FIGS. 3 and 4 illustrate an exemplary electrical device 300. In one exemplary embodiment the electrical device 300 is a direct attach connector. In this exemplary embodiment the electrical device 300 includes a first flexible substrate 302, a second flexible substrate 304, a third flexible substrate 305 extending from the first flexible substrate 302, a rigid substrate 306 having a mating edge 306A and terminating end 306B disposed between the first flexible substrate 302 and second flexible substrate 304. The electrical device also includes a first set of cables 307 coupled to the first flexible substrate 302, a second set of cables 308 coupled to the second flexible substrate 304, a third set of cables 310 coupled to the third flexible substrate 305, a first dielectric holder 314, a second dielectric holder 316, and third dielectric holder 317.

The first flexible substrate 302 extends from a first mating end 318 to a first terminating end 320. In one example, between the first mating end 318 and first terminating end 320 of the first flexible substrate 302 bends or flexes from a first position to the second position similar to the exemplary embodiment illustrated in FIGS. 1-2. In one example when the electrical device 300 is in the second position the electrical device 300 is a right-angle plug.

The second flexible substrate 304 extends in parallel spaced relation to the first flexible substrate 302. Similar to the first flexible substrate 302, the second flexible substrate 304 extends from a second mating end 328 to a second terminating end 330. In one example, between the second mating end 328 and second terminating end 330 the second flexible substrate 304 bends or flexes from a first position to a second position similar to the exemplary embodiment illustrated in FIGS. 1-2.

The third flexible substrate 305 extends from the first flexible substrate 302 at a third mating end 332 to a third terminating end 334. The third mating end 332 extends from the first flexible substrate 302 such that the third mating end 332 is offset longitudinally from the first mating end 318 of the first flexible substrate 302 and longitudinally offset from the second mating end 328 of the second flexible substrate 304. The third flexible substrate 305 includes a diagonal section 336 that extend diagonally from the third mating end 332 to a linear section 338 that extends from the diagonal section to the third terminating end 334 The linear section 338 extends in parallel to, and vertically spaced in relation to the first flexible substrate 302 and second flexible substrate 304.

The rigid substrate 306 is coupled to and extends between the first flexible substrate 302 and second flexible substrate 304 adjacent the first mating end 318 of the first flexible substrate 302 and the second mating end 328 of the second flexible substrate 304 to provide an electrical connection between the first and second flexible substrates 302 and 304. The rigid substrate 306 extends from a mating edge 306A to a terminating edge 306B. In this manner, the first flexible substrate 302, second flexible substrate 304, and terminating edge 306B define an open cavity 127. In this manner, the cavity 327 allows the first flexible substrate 302 and second flexible substrate 304 to bend. Additionally, in this example embodiment, the cavity is open, providing air therein; however, alternatively, a flexible substance such as foam could be disposed within, or fill the cavity, to provide insulation, enhance conductivity, improve durability, add robustness, and like The first set of cables 307 in one example comprises a plurality of signal conductors 342 disposed within a cable jacket 344, and a first ground signal conductor 343 that extends around and surrounds the dual signal conductors 342. Additionally, the plurality of dual signal conductors 342 are placed in side-by-side arrangement to form a first layer 346. The side-by-side plurality of dual signal conductors 342 within the first layer 346 are received by a plurality of corresponding signal contacts 348 such that each signal conductor 342 is received by a corresponding signal contact 348. In example embodiments the signal contacts 348 can be pads, plated via, and the like on the first flexible substrate 302. In one embodiment, each signal conductor 342 is a communication cable that relays a signal wherein EMI and interference along such cables results in cross talk.

The second set of cables 308 similarly in one example comprises a plurality of dual signal conductors 342 disposed within a cable jacket 344, and a second ground signal conductor 350 that extends around and surrounds the dual signal conductors 342. Additionally, the plurality of dual signal conductors 342 are placed in side-by-side arrangement to form a second layer 352. The side-by-side plurality of dual signal conductors 342 within the second layer 352 are received by a plurality of corresponding signal contacts 354 such that each signal conductor 342 is received by a corresponding signal contact 354. In example embodiments the signal contacts 354 can be pads, plated via, and the like on the second flexible substrate 304. In one embodiment, each signal conductor 342 is a communication cable that relays a signal wherein EMI and interference along such cables results in cross talk. Specifically, in an example embodiment, the second set of cables 308 has fewer dual signal conductors 342 than the first set of cables 306. In this manner, the signal conductors 342 of the first flexible substrate 302 are positioned directly above and are longitudinally aligned with one another, but laterally the signal conductors 342 of the first flexible substrate 302 are offset from the signal conductors 342 of the second flexible substrate 304. In this manner, the signal conductors 342 of the first flexible substrate 302 are staggered from the signal conductors 342 of the second flexible substrate 304 reducing the effects of cross talk and improving the signal quality.

The third set of cables 310 similarly in one example comprises a plurality of signal conductors 342, and a third ground signal conductor 356 disposed within a cable jacket 344 that extends around and surrounds the signal conductors 342. Additionally, the plurality of signal conductors 342 are placed in side-by-side arrangement to form a third layer 358. The side-by-side plurality of signal conductors 342 within the third layer 358 are received by a plurality of corresponding signal contacts 354 such that each signal conductor 342 is received by a corresponding signal contact 360. In example embodiments the signal contacts 360 can be pads, plated via, and the like on the third flexible substrate 305. In one embodiment, each signal conductor 342 is a communication cable that relays a signal wherein EMI and interference along such cables results in cross talk. Specifically, in an example embodiment, the second set of cables 308 has fewer signal conductors 342 than the first set of cables 306 and second set of cables 308. In this manner, the signal conductors 342 of both the first flexible substrate 302 and signal conductors 342 of the second flexible substrate 304 are positioned directly above and are longitudinally aligned with the signal conductors 342 of the third flexible substrate 305. Meanwhile, the conductors 342 of the second flexible substrate 304 is laterally offset from the signal conductors 342 of the third flexible substrate 305. Again, in this manner, the signal conductors 342 of the second flexible substrate 304 are staggered from the signal conductors 342 of the third flexible substrate 305, reducing the effects of cross talk and improving the signal quality.

The first dielectric holder 314 secures the first and third sets of cables 307, 309 to the first and third flexible substrates 302, 305 respectfully. In an example embodiment the first dielectric holder 314 is of one-piece construction and is an adhesive or hot melt. Alternatively, in another embodiment the first dielectric holder 314 is applied in two separate sections, one section securing the first set of cables 307 to the first flexible substrate 302, and another section securing the third set of cables 309 to the third flexible substrate 305. The second dielectric holder 316 meanwhile secures second set of cables 308 to the second flexible substrate 304, while the third dielectric holder 317 secures the plurality of side-by-side cable jackets 344 in the second layer 352 to one another. While in this exemplary embodiment the second dielectric holder 316 and third dielectric holder 317 are provided in separate sections, in another embodiment these sections are of one piece construction similar to the first dielectric holder 314 in relation to the first layer 346 and third layer 358. In an example embodiment each dielectric holder 314, 316, and 317 is an adhesive or hot melt.

Thus, provided is a flexible and rigid electric device 300 arrangement with staggered sets of cables 306, 308, 309 to reduce cross-talk. Additionally, this arrangement allows for the use of smaller gages of cables, increasing reduced cross-talk coupling at the termination end of the cables. Consequently, trace loss is also minimized.

Figure 5:
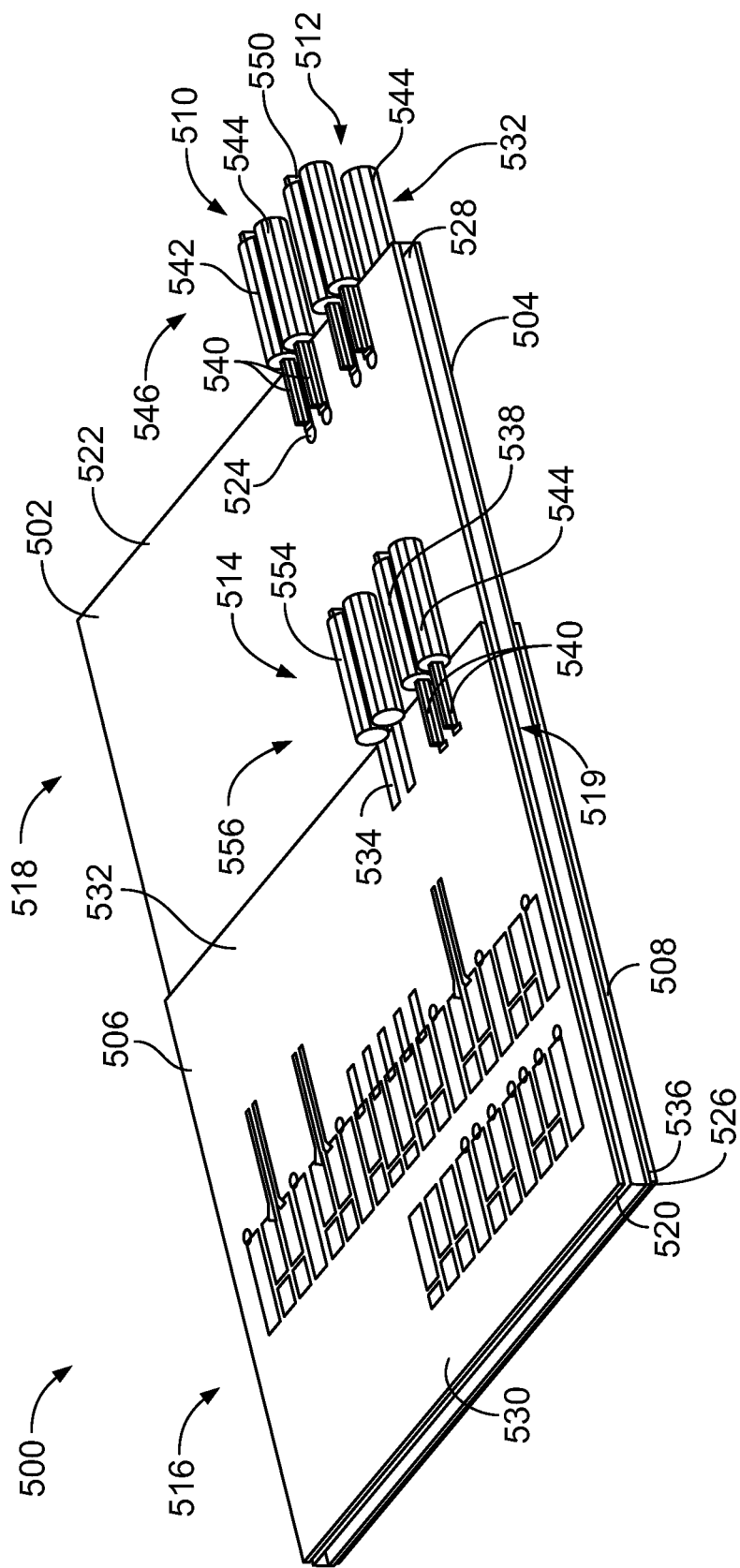
FIG. 5 is a perspective view of an electrical device in accordance with an exemplary embodiment.

FIG. 5 illustrates a perspective view of another exemplary electrical device 500 that presents a rigid and flex arrangement. In one exemplary embodiment the electrical device 500 is a direct attach connector. In this exemplary embodiment the electrical device 500 includes a first flexible substrate 502, a second flexible substrate 504, a third flexible substrate 506, a fourth flexible substrate 508, a first set of cables 510 coupled to the first flexible substrate 502, a second set of cables 512 coupled to the second flexible substrate 504, and a third set of cables 514 coupled to the third flexible substrate 506. While sections of dielectric holder material may be used to secure the sets of cables 510, 512, and 514, in this embodiment the dielectric holder material is not illustrated.

In this embodiment of the electrical device 500, the flexible substrates 502, 504, 506, and 508 are stacked on top of one another to form a rigid section 516 and a flexible section 518. The rigid section 516 includes each of the flexible substrates 502, 504, 506, and 508, or presents a four-layer arrangement. Because the rigid section 516 includes four layers, the layers together resist bending, causing them to function similarly to a rigid substrate. In this manner, flexible substrates may be used to form a rigid system, reducing the amount of different parts needed to manufacture the electrical device 500. The flexible section 518 includes only the second flexible substrate 504 and third flexible substrate 506 that each extend past the first flexible substrate 502 and fourth flexible substrate 508 to provide a two-layer arrangement. As illustrated, similar to previous embodiments, a cavity 519 is formed between the second flexible substrate 504 and 506 as a result of coupling (not shown)e between the substrates 504, 506 to facilitate bending of the flexible section 518. Optionally, a flexible substrate, foam, or the like can be placed between the second flexible substrate 504 and 506 to improve device characteristics but still provide flexibility. In this manner, the dual flexible substrates 504 and 506 bend in a manner as described in relation to the first and second flexible substrates 102 and 104 of FIGS. 1-2.

The first flexible substrate 502 extends from a mating end 520 to a terminating end 522 and also includes a plurality of signal contacts 524 at the terminating end 522 for receiving the first set of cables 510. The second flexible substrate 504 is coupled to the first flexible substrate 502. The second flexible substrate 504 similarly extends from a mating end 526 to a terminating end 528 and includes a plurality of signal contacts (not shown) at the terminating end 528 for receiving the second set of cables 512.

The third flexible substrate 506 is coupled to the first flexible substrate 502 and also extends from a mating end 530 to a terminating end 532 and includes a plurality of signal contacts 534 at the terminating end 532 for receiving the third set of cables 514. The third flexible substrate 506 does not extend the entire length of the first flexible substrate 502. Instead, the first flexible substrate 502 extends past the terminating end 532 of the third flexible substrate to the terminating end 522 of the first flexible substrate 502.

The fourth flexible substrate 508 is coupled to the second flexible substrate 504 and is in spaced relation to the third flexible substrate 506 such that the first flexible substrate 502 and second flexible substrate 504 are stacked, or sandwiched in-between the first flexible substrate 502 and second flexible substrate 504. The fourth flexible substrate 508 extends from a mating end 536 to a terminating end 538 and includes a plurality of signal contacts (not shown) for receiving a fourth set of cables (not shown). Similar to the third flexible substrate, the fourth flexible substrate 508 does not extend the entire length of the second flexible substrate 504. Instead, the second flexible substrate 504 extends past the terminating end 538 of the fourth flexible substrate 508 to the terminating end 528 of the second flexible substrate 504. In this manner, the first flexible substrate 502, second flexible substrate 504, third flexible substrate 506, and fourth flexible substrate 508 are stacked on top of each other to form the rigid section 516 even though each substrate individually is flexible. Meanwhile the portion of the first flexible substrate 502 and second flexible section 504 that extends past the third flexible substrate 506 and fourth flexible substrate 508 respectfully forms the flexible section 518 because with only two flexible substrates the first flexible substrate 502 and second flexible substrate 504 are able to flex or bend together, similarly to the previously described embodiments. Thus, during manufacturing, a rigid substrate is not required reducing manufacturing complexities. Additionally, this arrangement also allows for the sets of cables to be offset from one another both horizontally, and vertically, reducing cross talking and interference within the electrical device 500.

The first set of cables 510 in one example comprises a plurality of dual signal conductors 540, and a first ground signal conductor 542 disposed within a cable jacket 544 that extends around and surrounds the dual signal conductors 540. Each cable jacket 544 of the first set of cables 510 extends from adjacent the first flexible substrate 502 and over the second flexible substrate 504. Additionally, the plurality of dual signal conductors 540 are placed in side-by-side arrangement to form a first layer 546 of dual signal conductors 540. The side-by-side plurality of dual signal conductors 540 within the first layer 546 are received by a plurality of corresponding signal contacts 524 such that each signal conductor 540 is received by a corresponding signal contact 524. In example embodiments the signal contacts 524 can be pads, plated via, and the like on the first flexible substrate 502. In one embodiment, each signal conductor 540 is a communication cable that relays a signal wherein EMI and interference along such cables results in cross talk.

The second set of cables 512 in one example comprises a plurality of dual signal conductors 540, and a second ground signal conductor (not shown) disposed within a cable jacket 544 that extends around and surrounds the dual signal conductors 540. Each cable jacket 544 of the second set of cables 512 extends from adjacent the second flexible substrate 504 and away from the second flexible substrate 504. Additionally, the plurality of dual signal conductors 540 are placed in side-by-side arrangement to form a second layer 552 of dual signal conductors 540. The side-by-side plurality of dual signal conductors 540 within the second layer 552 are received by a plurality of corresponding signal contacts (not shown) such that each signal conductor 540 is received by a corresponding signal contact (not shown). In example embodiments the signal contacts can be pads, plated via, and the like on the second flexible substrate 504. In one embodiment, each signal conductor 540 is a communication cable that relays a signal wherein EMI and interference along such cables results in cross talk.

The third set of cables 514 in one example comprises a plurality of dual signal conductors 540, and a third ground signal conductor 554 disposed within a cable jacket 544 that extends around and surrounds the dual signal conductors 540. Each cable jacket 544 of the third set of cables 514 extends from adjacent the third flexible substrate 506 and away from the third flexible substrate 506. Additionally, the plurality of dual signal conductors 540 are placed in side-by-side arrangement to form a third layer 556 of dual signal conductors 540. The side-by-side plurality of dual signal conductors 540 within the third layer 556 are received by a plurality of corresponding signal contacts 534 such that each signal conductor 540 is received by a corresponding signal contact 534. In example embodiments the signal contacts 534 can be pads, plated via, and the like on the third flexible substrate 506. In one embodiment, each signal conductor 540 is a communication cable that relays a signal wherein EMI and interference along such cables results in cross-talk. The signal conductors 540 of the second flexible substrate 504 and third flexible substrate 506 in one embodiment are arranged to be offset or staggered including similar to the arrangement illustrated in the exemplary embodiment of FIG. 3-4. In this manner a high density electrical device 500 is provided with cross-talk that is reduced while height of the electrical device 500 is also improved.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A plug connector, comprising:
   at least one flexible substrate having a plurality of signal contacts, the flexible substrate extending from a terminating end to a mating end and configured to be flexible between the terminating end and mating end, the mating end being rigid and configured to be plugged into a mating electrical connector; wherein the at least one flexible substrate is a first flexible substrate and the plug connector further comprises:
   a second flexible substrate having a plurality of signal contacts, the second flexible substrate spaced from the first flexible substrate by a rigid substrate disposed between the first flexible substrate and the second flexible substrate;
   wherein the second flexible substrate extends from a terminating end to a mating end and is configured to be flexible between the terminating end and mating end; and
   wherein the rigid substrate is disposed adjacent the mating end of the first flexible substrate and the mating end of the second flexible substrate to electrically couple the first flexible substrate to the second flexible substrate.

2. The plug connector of claim 1, wherein the at least one flexible substrate includes a mating section that includes the mating end, a terminating section that includes the terminating end, and a flexible section configured to be flexible between the mating section and terminating section.

3. The plug connector of claim 2, wherein the at least one flexible substrate is configured to bend such that in a first position of the flexible section the mating section and terminating section align and in a second position of the flexible section the terminating section forms an angle of including and greater than 20 degrees with the mating section.

4. The plug connector of claim 3, wherein the flexible section is configured to bend so that the terminating section forms an angle in a range including and between 20 degrees and 90 degrees with the mating section.

5. The plug connector of claim 1, wherein the at least one flexible substrate is a flexible printed circuit board.

6. The plug connector of claim 1, further comprising:
   a communication cable including a differential pair of signal conductors, a grounding element, and a cable jacket surrounding the signal conductors and the grounding element; wherein each of the signal conductors is terminated to a corresponding signal contact of the at least one flexible substrate.

7. The plug connector of claim 1, further comprising a dielectric holder surrounding the communication cable and engaging the at least one flexible substrate.

8. The plug connector of claim 7, wherein the dielectric holder is hot melt.

9. An electrical device, comprising:
   a plug connector including a first flexible substrate having a plurality of signal contacts, the first flexible substrate extending from a terminating end to a mating end and configured to be flexible between the terminating end and mating end;

a second flexible substrate extending in parallel spaced relation to the first flexible substrate and having a plurality of signal contacts, the second flexible substrate extending from a terminating end to a mating end and configured to be flexible between the terminating end and mating end, the second flexible substrate spaced from the first flexible substrate by a rigid substrate disposed between the first flexible substrate and the second flexible substrate;

the rigid substrate disposed adjacent the mating end of the first flexible substrate and the mating end of the second flexile substrate to electrically couple the first flexible substrate and the second flexible substrate; and wherein the plug connector includes a rigid section disposed between and engaging the first flexible substrate and second flexible substrate at the mating end to electrically couple the first flexible substrate to the second flexible substrate, and the first flexible substrate and second flexible substrate move in relation to the rigid section.

10. The electrical device of claim 9, wherein the rigid section includes the first flexible substrate, the second flexible substrate, a third flexible substrate, and a fourth flexible substrate stacked on one another; and wherein the plug connector includes a flexible section that includes at least two of the first flexible substrate, the second flexible substrate, the third flexible substrate, and the fourth flexible substrate.

11. The electrical device of claim 10 wherein a portion of the first flexible substrate extends past the third flexible substrate at the terminating end of the third flexible substrate, and a portion of the second flexible substrate extends past the fourth flexible substrate at the terminating end of the fourth flexible substrate such that the stacked first, second, third, and fourth flexible substrates form the rigid section of the plug connector and the portion of the first flexible substrate extending past the third flexible substrate, and the portion of the second flexible substrate extending past the fourth flexible substrate form the flexible section of the plug connector.

12. The electrical device of claim 10, wherein the first flexible substrate includes a set of communication cables, the second flexible substrate includes a set of communication cables, and the third flexible substrate includes a set of communication cables; and wherein at least two of the set of communication cables of the first flexible substrate, the set of cables of the second flexible substrate, and the set of communication cables of the third flexible substrate are offset.

13. An electrical device, comprising:
a first flexible substrate having a plurality of signal contacts, the first flexible substrate extending from a terminating end to a mating end;
a first set of communication cables, each set of communication cables including a plurality of signal conductors; wherein each of the plurality of signal conductors is terminated to a corresponding signal contact of the first flexible substrate;

a second flexible substrate coupled to the first flexible substrate having a plurality of signal contacts, the second flexible substrate extending from a terminating end to a mating end; and a second set of communication cables, each set of communication cables including a plurality of signal conductors, wherein each of the plurality of signal conductors is terminated to a corresponding signal contact of the second flexible substrate;

wherein the second flexible substrate is coupled to the first flexible substrate by a rigid substrate disposed between the first flexible substrate and the second flexible substrate; and wherein the rigid substrate is disposed adjacent the mating end of the first flexible substrate and the mating end of the second flexible substrate to electrically couple the first flexible substrate to the second flexible substrate.

14. The electrical device of claim 13, further comprising:
a third flexible substrate having a plurality of signal contacts, the third flexible substrate extending from a terminating end to a mating end; wherein the first flexible substrate extends past the terminating end of the third flexible substrate and the first flexible substrate is configured to be flexible between the terminating end of the third flexible substrate and the terminating end of the first flexible substrate; and a third set of communication cables, each set of communication cables including a plurality of signal conductors; wherein each of the plurality of signal conductors is terminated to a corresponding signal contact of the third flexible substrate.

15. The electrical device of claim 14, further comprising:
a fourth flexible substrate having a plurality of signal contacts, the fourth flexible substrate extending from a terminating end to a mating end; wherein the second flexible substrate extends past the terminating end of the fourth flexible circuit board and the second flexible substrate is configured to be flexible between the terminating end of the fourth flexible substrate and the terminating end of the second flexible substrate.

16. The electrical device of claim 15, wherein each of the first flexible substrate, second flexible substrate, third flexible substrate, and fourth flexible substrate are flexible printed circuit boards.

17. The electrical device of claim 13, wherein the plug connector includes a third flexible substrate including a diagonal section extending from the second flexible substrate and a straight section extending from the diagonal section and parallel to the second flexible section, and the third flexible substrate includes a set of communication cables including a differential pair of signal conductors, and a cable jacket surrounding the differential pair of signal conductors; wherein the set of communication cables of the second flexible substrate are offset from the set of communication cables of the third flexible substrate.

* * * * *